United States Patent
Paganelli et al.

(10) Patent No.: US 9,865,902 B2
(45) Date of Patent: Jan. 9, 2018

(54) DEVICE FOR MONITORING AN ELECTRICAL ACCUMULATION BATTERY AND ASSOCIATED METHOD

(75) Inventors: Gino Paganelli, Clermont-Ferrand (FR); Thierry Auguet, Clermont-Ferrand (FR)

(73) Assignee: COMPAGNIE GENERALE DES ETABLISSEMENTS MICHELIN, Clermont-Ferrand (FR)

( * ) Notice: Subject to any disclaimer, the term of this patent is extended or adjusted under 35 U.S.C. 154(b) by 708 days.

(21) Appl. No.: 14/126,299

(22) PCT Filed: Jun. 14, 2012

(86) PCT No.: PCT/EP2012/061383
§ 371 (c)(1),
(2), (4) Date: Feb. 3, 2014

(87) PCT Pub. No.: WO2012/172030
PCT Pub. Date: Dec. 20, 2012

(65) Prior Publication Data
US 2014/0227571 A1    Aug. 14, 2014

(30) Foreign Application Priority Data
Jun. 15, 2011    (FR) ..................... 11 55218

(51) Int. Cl.
*G01N 27/416*    (2006.01)
*H01M 10/42*    (2006.01)
*G01R 31/36*    (2006.01)

(52) U.S. Cl.
CPC .... *H01M 10/4285* (2013.01); *G01R 31/3658* (2013.01); *G01R 31/3662* (2013.01); *G01R 31/3624* (2013.01); *G01R 31/3665* (2013.01)

(58) Field of Classification Search
USPC .......................................... 324/430
See application file for complete search history.

(56) References Cited

U.S. PATENT DOCUMENTS 5,680,031 A * 10/1997 Pavlovic ............... H02J 7/0093
                                                                320/145
6,307,377 B1 * 10/2001 Cummings ........ G01R 31/3651
                                                                320/136
(Continued)

FOREIGN PATENT DOCUMENTS

| CA | 2 448 277 A1 | 12/2002 |
| JP | 2005-345124 A | 12/2005 |
| WO | WO 2011/067646 A1 | 6/2011 |

*Primary Examiner* — Samuel Berhanu
(74) *Attorney, Agent, or Firm* — Fitzpatrick, Cella, Harper & Scinto

(57) ABSTRACT

A device is provided for monitoring an electrical accumulation battery that includes a set of cells connected in series. The device includes means for measuring a current intensity delivered by the battery; means for measuring an electrical voltage between an upstream connection point and a downstream connection point of each cell of the battery; a recorder that records a zero-current electrical voltage between the upstream connection point and the downstream connection point of each cell of the battery; and an electrical resistance estimator configured to periodically estimate an electrical resistance of each cell in the battery, between the upstream connection point and the downstream connection point.

8 Claims, 3 Drawing Sheets

(56) References Cited

U.S. PATENT DOCUMENTS

Figure 1:
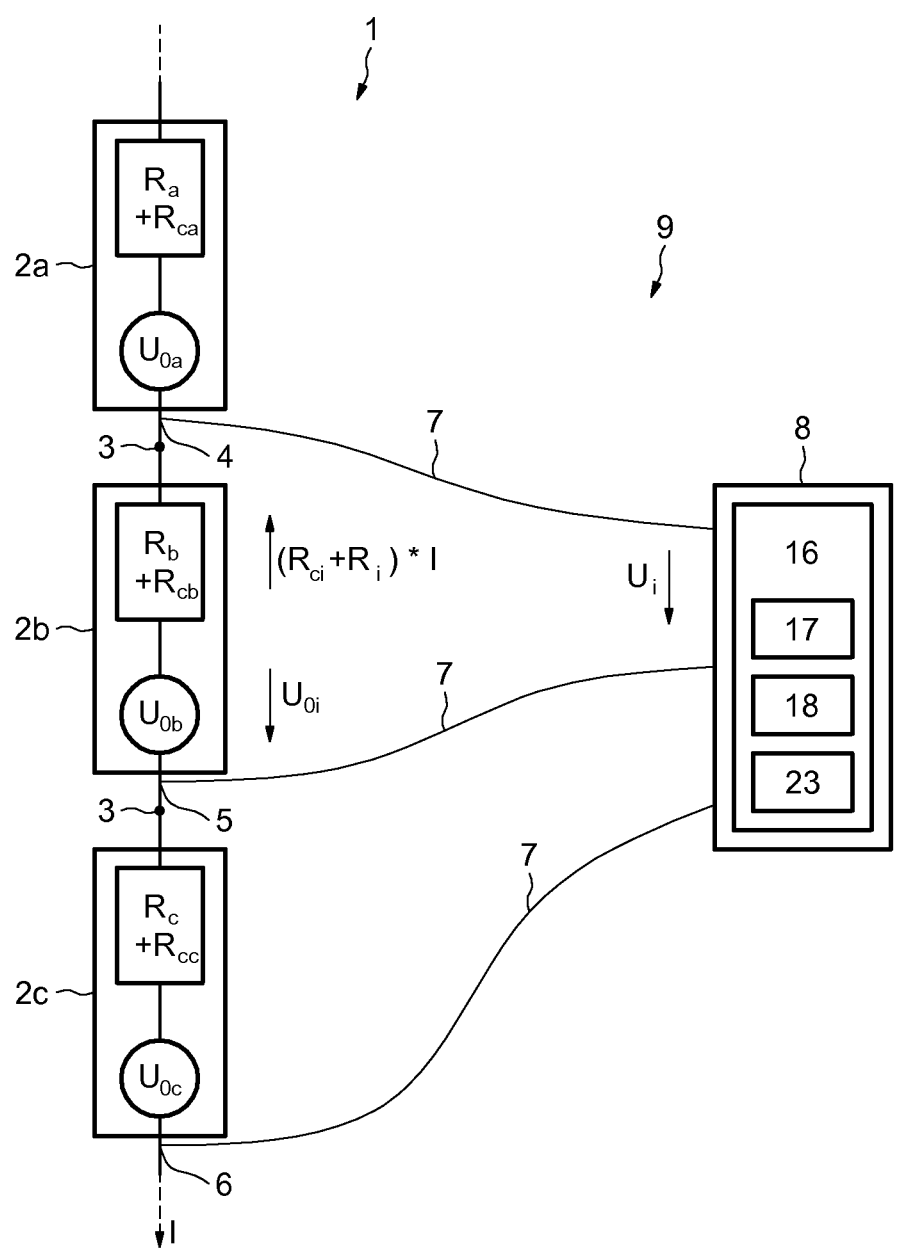

| | | |
|---|---|---|
| 7,096,098 B2 | 8/2006 | Auguet et al. ............ 701/22 |
| 8,036,793 B2 | 10/2011 | Auguet et al. ............ 701/42 |
| 8,046,132 B2 | 10/2011 | Auguet et al. ............ 701/41 |
| 2010/0244847 A1* | 9/2010 | Kudo .............. B60L 3/0046 324/433 |
| 2011/0301891 A1* | 12/2011 | Kim ............... B60L 3/0046 702/63 |
| 2012/0119745 A1* | 5/2012 | Deveau ........... G01R 31/3631 324/429 |
| 2012/0237843 A1 | 9/2012 | Paganelli ................ 429/429 |

* cited by examiner

DEVICE FOR MONITORING AN ELECTRICAL ACCUMULATION BATTERY AND ASSOCIATED METHOD

FIELD OF THE INVENTION

The invention relates to the field of the management of electrical power supply batteries.

RELATED ART

An electrical power supply battery usually consists of a set of individual cells connected in series. Each individual cell may comprise a group of elementary electrochemical elements, which are themselves interconnected in series or in parallel. The arrangement of the electrochemical elements is identical inside each individual cell.

In order to prevent any runaway in the chemical reactions, a battery may be equipped with a system in charge of individually monitoring each cell of the battery. This system, generally referred to by the acronym "BMS" (Battery Management System), is configured to measure the individual voltage of each cell, measure the current outgoing from the battery, calculate the state of charge of the battery, monitor the temperature level inside the battery, and equalise the voltages of the different individual cells.

The equalising can in particular be done following a battery charging step, by discharging, using a resistor, the cells which have a charge level substantially greater than that of the other cells.

Some batteries, for example lithium batteries, are particularly intolerant to voltage or temperature swings beyond certain predefined limits.

The monitoring of the temperature of the battery is generally handled using temperature probes, shrewdly distributed within the battery to give overall information on the temperature.

Because of the cost of the probes and of the associated electronics, one probe is generally provided to monitor several individual cells.

Such an arrangement can, in some cases, result in the non-detection of a failure that has resulted in very localised overheating of a cell precisely because it is located at a distance from a temperature probe.

Such local overheating may then be reflected in a high-amplitude thermal event on the battery as a whole, even a thermal runaway, and an explosion.

BRIEF DESCRIPTION OF EMBODIMENTS OF THE INVENTION

The aim of the invention is to prevent local overheating in any of the cells of the battery, without increasing the cost of the equipment needed to monitor the battery.

To this purpose, the invention proposes installing a monitoring system suitable for detecting an abnormal increase in the internal resistance of any individual cell of the battery, or any contact failure between two cells. This monitoring is put in place by using the sensors already present for supplying data to the battery monitoring system (BMS).

Thus, a device according to the invention for monitoring an electrical accumulation battery comprising a set of cells connected in series, comprises:

a means for measuring the current intensity delivered by the battery, a means for measuring an electrical voltage between an upstream connection point and a downstream connection point of each cell, a recorder of the zero-current electrical voltage between said upstream connection point and said downstream connection point of each cell, and an electrical resistance estimator, configured to periodically estimate the electrical resistance of each cell between its upstream connection point and its downstream connection point.

Advantageously, the electrical resistance estimator comprises a memory in which an average resistance value, averaged over of the set of cells, is stored, and a resistance comparator configured for comparing the resistance of each cell to the average resistance of the set of cells, and configured to deliver an alert signal if the absolute value of the difference between a resistance of one of the cells and the average resistance exceeds a first threshold.

Advantageously, the electrical resistance estimator is configured to constantly re-assess at regular time intervals, the estimate of the electrical resistance of each cell, throughout the time when the battery is being used either in charge or in discharge mode.

In other words, a periodic estimation is performed throughout the duration the time periods when the battery is being used in charge or in discharge mode.

It is thus possible to detect a failure of one of the cells, or a failure of a connection between cells, at any time while the battery is being utilized.

In this preferred embodiment, the estimation takes place in particular during battery recharging phases through regenerative braking, if the battery is installed on an electric vehicle configured to provide this type of braking, and takes place in any case during the battery recharging phases on a fixed electrical network. The estimation also takes place during any phase when the battery is delivering power to one or more energy consuming devices, regardless of the type of devices connected to the battery.

In another embodiment, the control of the internal resistance of the cells of the battery can be performed during most of the periods when the battery is being used in charge or discharge mode, still excluding some few transient operating periods in which, for example, the current or voltage fluctuations might generate measurement errors leading to an incorrect diagnosis.

According to a preferred embodiment, the electrical resistance estimator is configured to compare the resistance of each cell to a reference resistance value, and to deliver an alert signal if the difference between a resistance of one of the cells and the reference resistance value exceeds a second threshold.

The recorder of the zero-current voltages can be configured to update the recorded values each time the current from the battery reaches zero. It is considered that the current from the battery reaches zero if its absolute value becomes less than a threshold current value, for example less than 0.1 A, or preferably less than 0.01 A.

The recorder of the zero-current voltages can also be configured to activate an out-of-date-warning signal if the recorded values have not been updated for a period greater than a minimum updating period. Advantageously, the zero-current voltage recorder is configured to determine the out-of-date-warning Boolean variable as a function of the date of the last updating of the zero-current voltages.

According to another variant embodiment, the recorder of the zero-current voltages can be configured to activate an out-of-date-warning signal if, since the recorded values were updated, the state of charge of the battery has increased or has decreased by a value greater than a state-of-charge threshold fraction.

When the out-of-date-warning variable is activated, the electrical resistance estimator is configured to compare the resistance of each cell only to the average resistance of the set of cells, without comparing the resistance of each cell to the reference resistance value.

The device may comprise a synchronisation device suitable for synchronising each series of measurements of the voltages between the upstream connection point and the downstream connection point of the different cells, with a measurement of the current intensity outgoing from the battery.

According to another aspect, a battery is equipped with a device as described previously. In this battery, the upstream connection point for measuring the voltage of a cell is also the downstream connection point for measuring the voltage of an adjacent cell in the series, except for two end cells of the battery.

Advantageously, between each upstream connection point and each downstream connection point, there are the same number of elementary cells and the same number of resistive connection elements between cells.

According to yet another aspect, in a method for monitoring the cells of an electrical accumulation battery, the voltage between an upstream connection point and a downstream connection point of each cell of the battery is periodically measured, the current intensity outgoing from the battery is simultaneously measured, and a resistance associated with the cell between the upstream connection point and the downstream connection point is calculated, by dividing the voltage differential relative to a zero-current voltage, by the intensity outgoing from the battery.

Preferentially, the resistance of each cell is periodically compared to an average resistance of the set of cells, and an alert signal is delivered if the absolute value of the difference between a resistance of one of the cells and the average resistance exceeds a first threshold.

Advantageously, the zero-current voltage values of each cell are re-estimated each time the current from the reaches zero.

According to a preferred embodiment, an out-of-date-warning Boolean variable is activated if the zero-current voltage values have not been updated for a period greater than a minimum updating period.

According to another advantageous embodiment, an out-of-date-warning Boolean variable is activated if, since the zero-current voltage values have been updated, the state of charge of the battery has increased or decreased by a value greater than a state-of-charge threshold fraction.

Figure 2:
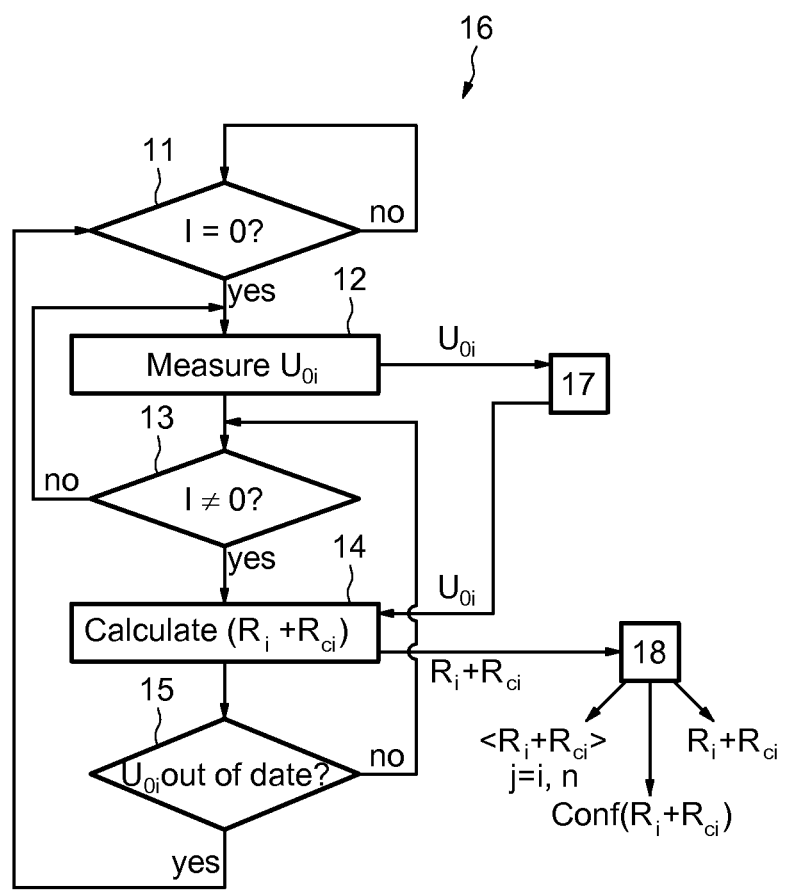
Figure 3:
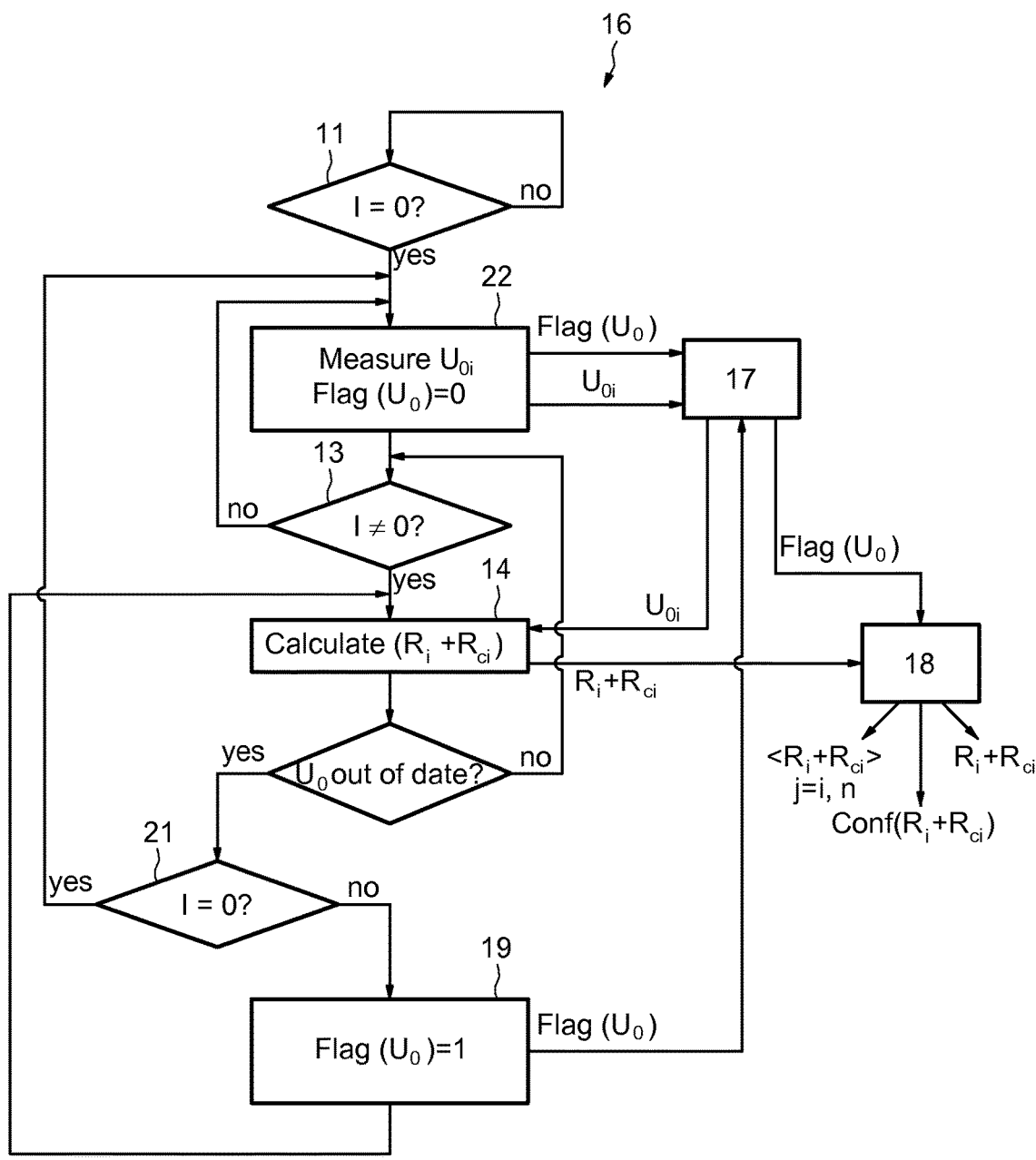

Other aims, features and advantages of the invention will be understood upon reading the following description, given solely as a non limiting example, and referring to the appended drawings, in which:

FIG. 1 is a simplified schematic representation of an electrical accumulation battery equipped with a monitoring system according to the invention, FIG. 2 is an example of an algorithm for monitoring a battery equipped with a monitoring system according to the invention, and FIG. 3 is a variant of the monitoring algorithm of FIG. 2.

DETAILED DESCRIPTION OF EMBODIMENTS OF THE INVENTION

As illustrated in FIG. 1, a battery 1 comprises cells $2_a$, $2_b$ and $2_c$ . . . interlinked by connection elements 3. The battery 1 is equipped with a monitoring device 9 comprising an electronic control unit 8, and connections 7 connecting, for each cell, an upstream connection point of the cell, for example here for the cell $2_b$, the point 4, and a downstream connection point of the cell, here for the cell $2_b$, the point 5.

The electronic control unit 8 comprises a recorder of zero-current voltages 17, a resistance estimator 16, a resistance comparator 18, and a memory 23 for storing an average resistance value.

The definition of upstream and downstream of a cell should be understood here, and hereinafter in the text, to be an upstream and a downstream defined in relation to the direction of flow of a current I within the battery, when the battery is supplying electrical energy to an external circuit.

The battery 1 delivers or receives a current I which is the same current which passes through each of the cells $2_a$, $2_b$, $2_c$ . . . . At any instant, each cell can be characterized by a voltage $U_i$, here $U_a$, $U_b$, $U_c$ . . . between its upstream connection point and its downstream connection point. At the same instant, in the same state of charge, each cell can be characterized by an offload voltage also called zero-current voltage $U_{0i}$, here referenced $U_{0a}$, $U_{0b}$, $U_{0c}$ . . . . The offload voltage is the voltage which will be established between the upstream connection point and the downstream connection point of the cell if the external electrical circuit usually connected to the two terminals of the battery 1 is disconnected or interrupted.

The electronic control unit 8 comprises measurement means making it possible to determine, for each cell, a voltage between its upstream connection point 4 and its downstream connection point 5, for example for the cell $2_b$, the voltage $U_i$.

The electronic control unit 8 also comprises a measurement means enabling it to determine the intensity I flowing to or from the battery 1, substantially at the same time as it performs a series of voltage measurements, which comprise measurement of voltage $U_i$ for each cell. The electronic control unit 8 comprises, for this purpose, synchronisation means, enabling it to periodically perform a series of acquisitions of all the voltages $U_i$ of the different cells that make up the battery 1, as well as perform at least one acquisition of current intensity substantially at the same time as the acquisitions of the voltage values are performed.

A single connection point is arranged between each pair of contiguous cells, so that the upstream connection point of one cell, for example here the point 4 for the cell $2_b$, is at the same time a downstream connection point for another cell, here for the cell $2_a$. Similarly, the cell $2_c$ here comprises an upstream connection point 5 which is at the same time the downstream connection point of the cell $2_b$, and the cell $2_c$ itself comprises a downstream connection point 6.

The zero-current voltage recorder 17 is configured to store the values $U_{0a}$, $U_{0b}$, $U_{0c}$, . . . $U_i$ . . . measured between the upstream connection point and the downstream connection point of each cell, each time the battery current I reaches zero.

The resistance of each cell between its upstream point and its downstream point varies as a function of the electrochemical state of the cell. This resistance is the sum of a first term $R_i$ (here $R_a$, $R_b$, $R_c$ . . . ) standing for the internal resistance of the one or more electrochemical elements configured to deliver the electrical energy produced by the cell, and of a term $R_{ci}$ (here $R_{ca}$, $R_{cb}$, $R_{cc}$ . . . ) standing for the resistance of at least one of the connection elements 3 interlinking the different cells, this at least one connection element being interposed between the upstream voltage measurement point and the downstream voltage measurement point of the cell.

An increase in the total internal resistance $R_i+R_{ci}$ of a cell may be caused by an electrochemical event, which results in an increase in the term $R_i$, or by a contact defect between two neighbouring cells, which results in an increase in the term $R_{ci}$.

The internal resistance of a cell i, including the electrochemical term $R_i$ and the contact term $R_{ci}$, is also equal to:

$$(R_i + R_{ci}) = \frac{U_{0i} - U_i}{I} \quad \text{Equation (1)}$$

From the values $U_i$, $U_{0i}$ and I acquired by the electronic control unit 8, the resistance estimator 16 is configured to assess the resistance $R_i+R_{ci}$ of each cell according to the equation (1), and transmits this value to the resistance comparator 18, which checks whether the calculated resistance remains within limits defined as acceptable.

An average value of the resistances $R_i+R_{ci}$ can be calculated for each series of measurements measuring a voltage for each cell. This average value:

$$\langle R_j + R_{cj} \rangle_{j=1,n}$$

can, for example, be obtained by averaging the resistances estimated for each cell following a single voltage measurement for each cell. Alternatively, it may result from an average value filtered over a number of voltage acquisitions for each cell.

The resistance value of a specific cell may, for example, be rated to be acceptable if, on the one hand, it remains below a threshold value $R_{max}$, and if, on the other hand, this resistance value of the specific cell remains sufficiently close to an average value $$\langle R_j + R_{cj} \rangle_{j=1,n},$$

resulting from an averaging of resistance values of all the cells acquired at the same time as the resistance value of the specific cell. The threshold value $R_{max}$ can, for example, be initially defined from a likely maximum internal resistance of a cell and a maximum acceptable contact resistance between cells.

It is thus possible to define a Boolean variable $\text{Conf}(R_i+R_{ci})$ associated to a condition of conformity of the resistance. This Boolean variable Conf may be expressed as follows:

$$\text{Conf}(R_i + R_{ci}) = 1 \quad \text{Equation (2)}$$

$$\text{if both } \left| (R_i + R_{ci}) - \langle R_j + R_{cj} \rangle_{j=1,n} \right| \leq A$$

$$\text{And } R_i + R_{ci} \leq R_{max}$$

Conf $(R_i+R_{ci})$ is a Boolean variable which is then positive if the resistance of the cell I is deemed to be normal.

A value $U_{0i}$ representing the off-load voltage of each cell depends from the state of charge of the cell. It responds to relatively slow polarisation mechanisms, but must be regularly re-evaluated. An out-of-date-warning criterion flag($U_0$) can be associated with it, which indicates that the values calculated from the stored values $U_{0i}$ are likely to be unaccurate. This out-of-date-warning criterion flag($U_0$) can, for example, be defined as a Boolean variable which becomes positive if the current I has not reached zero during a period of time greater than a minimum period, or if the current I did not reach zero for a time period long enough to make it possible to perform an acquisition of the off-load voltages $U_{0i}$ of all the cells.

The out-of-date-warning indicator flag($U_0$) can also be activated, in addition, or independently of the monitoring of the time elapsed since the last updating of the values $U_{0i}$, by monitoring the amplitude of the variation of the state of charge of the battery since the last updating of the values $U_{0i}$.

To this end, various estimators of the state of charge of the battery can be used, which are known from the prior art, and which generally seek to represent the theoretical SOC (State Of Charge) value that satisfies the equation:

$$\frac{d(SOC)}{dt} = -\frac{I}{Q}$$

in which t is the time,
I is the intensity of current delivered by the battery,
and Q is the capacity of the battery at the instant t, in Ah (ampere·hours).

An out-of-date-warning indicator flag($U_0$) can, for example, be defined as follows, assuming the last updating of all the voltages $U_{0i}$ took place at an instant $t_{actu}$:

flag($U_0$)=1 if $t-t_{actu}>\Delta t$ or if $|SOC(t)-SOC(t_{actu})|>\Delta SOC_1$ or if $\int_{t_{actu}}^{t}|dSOC(u)|du>\Delta SOC_2$  Equation (3)

in which $\Delta t$ is a duration threshold, $\Delta SOC_1$ and $\Delta SOC_2$ are state-of-charge variation thresholds.

One of the three conditions listed above, or the alternative between two of the three conditions, or the alternative between all three conditions can be retained as the out-of-date-warning criterion.

FIG. 2 illustrates a possible mode of operation of the resistance estimator 16 of the electronic control unit 8.

FIG. 2 contains a few references signs common to FIG. 1, the same elements then being designated by the same references signs. When the battery is starting to interact with an external electrical circuit, when the battery is first connected to the monitoring device 9, the resistance estimator 16 is first of all made to perform a waiting loop 11 until the current I from the battery 1 passes through zero.

When the current I from the battery passes through zero, the resistance estimator 16 performs a series of acquisitions, acquiring a set of values $U_{0i}$ of the voltages between the terminals of each cell of the battery. The resistance estimator 16 transmits said voltages to the zero-current voltage recorder 17. For this, it is possible to consider that the current I from the battery passes through zero (or reaches zero) when the absolute value of the current I is below a current threshold $I_{zero}$, i.e. $|I| \leq I_{zero}$.

After having performed this acquisition in a step 12, the resistance estimator 16 performs some tests 13 to ascertain whether the current I from the battery has become different from zero, that is to say $|I|>I_{zero}$. If such is not the case, the resistance estimator 16 reiterates the step 12, re-updates the off-load voltage values $U_{0i}$ of the different cells and sends them to the recorder 17.

When, following the test 13, a non-zero current I is detected, the resistance estimator 16 performs, at a step 14, an acquisition of the voltages $U_i$ between the upstream and downstream points of all the cells, and, for each cell i, calculates its internal resistance $R_i+R_{ci}$. It then transmits all of the duly calculated resistances values $R_i+R_{ci}$ to the resistance comparator 18.

The resistance estimator 16 then performs, in a step 15, an out-of-date-warning test to ascertain whether the off-load voltage values stored by the zero-current voltage recorder are still relevant. The out-of-date-warning test 15 may correspond to the activation of a Boolean variable flag($U_0$) according to the conditions of the equation (3), for example.

If the out-of-date-warning variable is activated, that is to say if the group of values $U_{0i}$ is considered to be out of date, the resistance estimator 16 goes back to the step 11 and waits till the current intensity I reaches zero again. The resistance estimator 16 then repeats, in order, the steps 12, 13 and so on.

At the step 12, the voltage recorder 17 receives and stores the off-load voltage values of different cells. The voltage recorder 17 then provides said values at the step 14, to make it possible to calculate the values $R_i+R_{ci}$ according to the equation (1). The resistance comparator 18 stores all of the resistances calculated for the different cells, following a series of acquisitions of one values $U_i$ for each cell. According to a variant embodiment, the resistance comparator 18 stores the values $R_i+R_{ci}$ of the resistances calculated following several series of acquisitions of voltage values $U_i$ between the upstream and downstream points of all the cells. Once the values $R_i+R_{ci}$ corresponding to all the cells have been stored for at least one series of acquisitions, the resistance comparator 18 calculates an average value $$\langle R_j + R_{cj} \rangle_{j=1,n}$$

of these resistances and stores them in the memory 23 (not shown on FIG. 2). The resistance comparator 18 can then calculate a conformity Boolean variable Conf($R_i+R_{ci}$) for each cell of the battery, for example according to the equation (2), and may transmit an alert signal if at least one of these conformity Boolean variables is negative. The resistance comparator 18 can transmit to other control units (not represented), either all the calculated resistance values. According to another embodiment the resistance comparator 18 may transmit only abnormal resistance values, when such an abnormal value is detected by the function Conf($R_i+R_{ci}$).

FIG. 3 illustrates a variant operating mode of the resistance estimator 16. FIG. 3 contains elements common to FIGS. 1 and 2, the same elements then being designated by the same reference signs. As in FIG. 2, the resistance estimator 16 begins by engaging in a waiting loop, until the intensity I reaches zero at a step 11. The estimator 16 then performs a series of acquisitions $U_{0i}$ at a step 22, and, when it has finished this series of acquisitions, it deactivates the out-of-date-warning indicator flag($U_0$). It then transmits to the voltage recorder 17 a deactivated value of the out-of-date-warning indicator $U_0$ and also transmits the off-load voltage values of all of the cells of the battery.

It then performs a test 13 to ascertain whether the current I has become non-zero. If not, it reiterates the step 22. When the current I becomes non-zero, the resistance estimator 16 performs, at a step 14, a series of acquisitions of the voltages $U_i$ between the upstream and downstream points of all the cells of the battery, and calculates the corresponding resistances $R_i+R_{ci}$ of all the cells, then sends the corresponding resistances $R_i+R_{ci}$ to the resistance comparator 18.

It then performs the out-of-date-warning test 15, for example according to the equation (3). If the test 15 indicates that the off-load voltage values are out of date, the resistance estimator 16 performs a test 21 to ascertain whether the current intensity I is zero. If this current I is zero or approximately zero, i.e. $|I| \leq I_{zero}$, the estimator reiterates the step 22 of acquisition of the off-load voltages of the different cells, and deactivates the out-of-date-warning indicator flag($U_0$).

If the current I is not zero, the resistance estimator 16 transmits, at a step 19, the activated value of the out-of-date-warning indicator to the voltage recorder 17, and goes back to the step 14 in which it performs a series of acquisitions of the voltages between the upstream points and the downstream points of all the cells of the battery.

The resistance estimator 16 deduces from the series of acquired values, using also the values $U_{0i}$ available from the voltage recorder 17, the resistances $R_i+R_{ci}$ of all the cells. The resistance estimator 16 sends these values $R_i+R_{ci}$ to the resistance comparator 18, which also receives the value of the out-of-date-warning indicator flag($U_0$) from the voltage recorder 17.

Even when the out-of-date-warning indicator is activated, the resistance comparator 18 may perform a conformity test on all of the values $R_i+R_{ci}$ calculated from the latest series of acquisitions of voltage values measured between the upstream and downstream points of each cell. The resistance comparator 18 may for instance apply a conformity test which is different depending on the value of the out-of-date-warning indicator flag($U_0$). If the out-of-date-warning indicator is activated, the resistance comparator 18 may be configured to compare each resistance value of each cells to the sole value of the average resistance of the set of cells $$\langle R_j + R_{cj} \rangle_{j=1,n}$$

calculated during the same series of acquisitions and stored in the memory 23. If the out-of-date-warning indicator is activated, the resistance comparator 18 does not compare these resistances to an absolute value $R_{max}$.

The object of the invention is not limited to the embodiments described, and may vary according to many different embodiments, especially with regard to the estimation mode of the out-of-date-warning criterion, the estimation mode of the criterion of conformity of the internal resistances of the cells, or with regard to the arrangement constituting each cell between an upstream connection point and a downstream connection point. According to a specific embodiment, a conformity criterion may be defined, by monitoring the variation gradient of each cell resistance, and comparing it to an acceptable maximum gradient.

Each individual cell may comprise a plurality of electrochemical elements and a plurality of contact elements mounted, either in series or in parallel, but arranged identically from one cell to another.

The monitoring device according to the invention makes it possible, by using sensors already present in the battery monitoring system, to individually monitor the risks of overheating of each cell, and identify a cause of overheating, even before a noticeable temperature rise of the cell can be measured. By virtue of the regular re-estimation of the zero-current voltage, this monitoring is performed continuously during the normal operation of the battery, without requiring charge or discharge cycles specific to the monitoring method. A degraded mode of operation is provided to make it possible to continue the monitoring without generating unnecessary alerts, if the zero-current voltage temporarily is at risk of no longer being relevant.

Furthermore, this monitoring system is little or not at all influenced by the average temperature of the battery.

The invention claimed is:

1. A device for monitoring an electrical accumulation battery that includes a plurality of cells connected in series, the device comprising:
    a current measurer, which measures a value of a current (I) delivered by the battery;
    a voltage measurer, which measures a value of an electrical voltage ($U_i$) between an upstream connection point and a downstream connection point of each cell of the plurality of cells of the battery;
    a recorder, which records a zero-current electrical voltage ($U_{0i}$) between the upstream connection point and the downstream connection point of each cell of the plurality of cells, the zero-current electrical voltages ($U_{0i}$) of the plurality of cells being recorded each time the value of the current (I) delivered by the battery reaches zero; and
    an electrical resistance estimator circuit, which periodically estimates an electrical resistance ($R_i+R_{ci}$) of each cell of the plurality of cells, between the upstream connection point and the downstream connection point of the cell,
    wherein each time the value of the current (I) delivered by the battery is measured to be zero the recorder records the zero-current electrical voltages ($U_{0i}$) of the plurality of cells as updated voltages,
    wherein the electrical resistance estimator circuit includes:
        a memory in which an average resistance ($\langle R_j+R_{cj}\rangle$) of the plurality of cells is stored, and
        a resistance comparator, which compares the electrical resistance ($R_i+R_{ci}$) of each cell of the plurality of cells to the average resistance ($\langle R_j+R_{cj}\rangle$) of the plurality of cells, and which delivers an alert signal if an absolute value of a difference between a resistance of any cell of the plurality of cells and the average resistance ($\langle R_j+R_{cj}\rangle$) of the plurality of cells exceeds a first threshold,
    wherein the electrical resistance estimator circuit compares an electrical resistance ($R_i+R_{ci}$) of each cell of the plurality of cells to a reference resistance, and delivers an alert signal if a difference between a resistance of any cell of the plurality of cells and the reference resistance exceeds a second threshold,
    wherein the recorder activates an out-of-date-warning Boolean variable (flag($U_0$)) as a function of a date of a last updating of the zero-current voltages ($U_{0i}$) of the plurality of cells, and
    wherein, when the out-of-date-warning Boolean variable is activated, the electrical resistance estimator circuit takes into account only a comparison of the electrical resistance ($R_i+R_{ci}$) of each cell of the plurality of cells to the average resistance ($\langle R_j+R_{cj}\rangle$) of the plurality of cells.

2. The device according to claim 1, wherein the electrical resistance estimator circuit compares an electrical resistance ($R_i+R_{ci}$) of each cell of the plurality of cells to a reference resistance, and delivers an alert signal if a difference between a resistance of any cell of the plurality of cells and the reference resistance exceeds a second threshold.

3. The device according to claim 1, further comprising a synchronisation circuit, which synchronises each series of measurements of the electrical voltages ($U_i$) of the plurality of cells, measured between the upstream connection point and the downstream connection point of each cell of the plurality of cells, with a measurement of the value of the current (I) delivered by the battery.

4. The device according to claim 1, wherein the electrical resistance estimator circuit repeatedly re-assesses, at regular time intervals, the electrical resistance ($R_i+R_{ci}$) of each cell of the plurality of cells for a duration when the battery is being used either in a charge mode or in a discharge mode.

5. An electrical accumulation battery, comprising:
    a plurality of cells connected in series; and
    a monitoring device that includes:
        a current measurer, which measures a value of an output current (I),
        a voltage measurer, which measures a value of an electrical voltage ($U_i$) between an upstream connection point and a downstream connection point of each cell of the plurality of cells,
        a recorder, which records a zero-current electrical voltage ($U_{0i}$) between the upstream connection point and the downstream connection point of each cell of the plurality of cells, the zero-current electrical voltages ($U_{0i}$) of the plurality of cells being recorded each time the value of the output current (I) reaches zero, and
        an electrical resistance estimator circuit, which periodically estimates an electrical resistance ($R_i+R_{ci}$) of each cell of the plurality of cells, between the upstream connection point and the downstream connection point of the cell,
    wherein, for each cell except a first cell and a last cell of the plurality of cells, the upstream connection point of the cell is also the downstream connection point of an adjacent cell, and
    wherein each time the value of the current (I) is measured to be zero the recorder records the zero-current electrical voltages ($U_{0i}$) of the plurality of cells as updated voltages,
    wherein the electrical resistance estimator circuit includes:
        a memory in which an average resistance ($\langle R_j+R_{cj}\rangle$) of the plurality of cells is stored, and
        a resistance comparator, which compares the electrical resistance ($R_i+R_{ci}$) of each cell of the plurality of cells to the average resistance ($\langle R_j+R_{cj}\rangle$) of the plurality of cells, and which delivers an alert signal if an absolute value of a difference between a resistance of any cell of the plurality of cells and the average resistance ($\langle R_j+R_{cj}\rangle$) of the plurality of cells exceeds a first threshold, wherein the electrical resistance estimator circuit compares an electrical resistance ($R_i+R_{ci}$) of each cell of the plurality of cells to a reference resistance, and delivers an alert signal if a difference between a resistance of any cell of the plurality of cells and the reference resistance exceeds a second threshold, wherein the recorder activates an out-of-date-warning Boolean variable (flag($U_O$)) as a function of a date of a last updating of the zero-current voltages ($U_{Oi}$) of the plurality of cells, and wherein, when the out-of-date-warning Boolean variable is activated, the electrical resistance estimator circuit takes into account only a comparison of the electrical resistance ($R_i+R_{ci}$) of each cell of the plurality of cells to the average resistance ($\langle R_j+R_{cj} \rangle$) of the plurality of cells.

6. The battery according to claim 5, where, between each upstream connection point and each downstream connection point of the plurality of cells, there are a same number of elementary cells and a same number of resistive connection elements.

7. A method for monitoring a plurality of cells of an electrical accumulation battery, the method comprising:
a voltage measurement step of measuring a voltage ($U_i$) between an upstream connection point and a downstream connection point of each cell of the plurality of cells of the battery at regular time intervals;
a current measurement step of measuring a current (I) delivered by the battery simultaneously with the measuring of the voltages ($U_i$);
a recording step of, each time the current (I) delivered by the battery reaches zero, recording in a recorder zero-current voltages ($U_{Oi}$) of the plurality of cells, the zero-current voltages ($U_{Oi}$) being the voltages ($U_i$) between the upstream connection point and the downstream connection point of each cell of the plurality of cells measured in the voltage measurement step when the current (I) delivered by the batter reaches zero;
a resistance calculation step of calculating, for each cell of the plurality of cells, an electrical resistance ($R_i+R_{ci}$) between the upstream connection point and the downstream connection point, the calculating including dividing a voltage differential, which is a difference between the voltage ($U_i$) and the zero-current voltage ($U_{Oi}$), by the current (I) delivered by the battery, wherein the zero-current voltage ($U_{Oi}$) of each cell of the plurality of cells is determined each time the current (I) delivered by the battery reaches zero, and wherein each time the current (I) delivered by the battery is measured to be zero the recorder records the zero-current voltages ($U_{Oi}$) of the plurality of cells as updated voltages, wherein an out-of-date-warning Boolean variable (flag ($U_O$)) is activated:
if the zero-current voltage values ($U_{Oi}$) of the plurality of cells have not been updated for a period greater than a minimum updating period occurs, or
if, after the zero-current voltage values ($U_{Oi}$) of the plurality of cells have been recorded as updated voltages, a state of charge of the battery has increased or decreased by a value greater than a state-of-charge threshold fraction occurs.

8. The method according to claim 7, wherein the electrical resistance ($R_i+R_{ci}$) of each cell of the plurality of cells is periodically compared to an average resistance ($\langle R_j+R_{cj} \rangle$) of the plurality of cells, and an alert signal is delivered if an absolute value of a difference between a resistance of one of the plurality of cells and the average resistance exceeds a first threshold.

* * * * *

UNITED STATES PATENT AND TRADEMARK OFFICE
CERTIFICATE OF CORRECTION

PATENT NO. : 9,865,902 B2  
APPLICATION NO. : 14/126299  
DATED : January 9, 2018  
INVENTOR(S) : Gino Paganelli Page 1 of 1

It is certified that error appears in the above-identified patent and that said Letters Patent is hereby corrected as shown below:

In the Specification

Column 2
Line 13, "over of" should read --over--.
Line 25, "duration" should read --duration of--.

Column 3
Line 40, "from the" should read --from the battery--.

Column 5
Lines 54-55, "Conf($R_i$+$R_{ci}$)" should read --*Conf($R_i$+$R_{ci}$)*--.
Line 56, "Conf" should read --*Conf*--.
Line 66, "Conf($R_i$+$R_{ci}$)" should read --*Conf($R_i$+$R_{ci}$)*--.

Column 7
Line 13, "resistances" should read --resistance--.
Line 33, "values" should read --value--.
Line 49, "Conf($R_i$+$R_{ci}$)" should read --*Conf ($R_i$+$R_{ci}$)*--.
Line 54, "either all" should read --some or all--.
Line 57, "Conf($R_i$+$R_{ci}$)" should read --*Conf($R_i$+$R_{ci}$)*--.

Column 8
Line 42, "each cells" should read --each cell--.

In the Claims

Column 12
Line 3, Claim 7 "batter" should read --battery--.

Signed and Sealed this  
Tenth Day of July, 2018

Andrei Iancu  
*Director of the United States Patent and Trademark Office*